United States Patent [19]
Oliver et al.

[11] Patent Number: 5,493,220
[45] Date of Patent: Feb. 20, 1996

[54] MAGNETO-OPTIC KERR EFFECT STRESS SENSING SYSTEM

[75] Inventors: Steven A. Oliver, Dedham; Charles A. DiMarzio, Cambridge; Stephen W. McKnight, Needham, all of Mass.

[73] Assignee: Northeastern University, Boston, Mass.

[21] Appl. No.: 26,589

[22] Filed: Mar. 5, 1993

[51] Int. Cl.$^6$ .......................... G01R 33/032; G02F 1/09; G01B 7/24

[52] U.S. Cl. ..................... 324/209; 324/244.1; 356/35.5; 359/282

[58] Field of Search ............................... 324/244, 244.1, 324/96, 260, 209, 212, 226, 225, 223, 72; 250/225, 227.17, 231.14; 340/631, 665; 73/862.33, 862.34, 862.36; 350/374–378; 356/33, 32, 35.5; 359/280–284

[56] References Cited

U.S. PATENT DOCUMENTS

| | | |
|---|---|---|
| 3,609,723 | 9/1971 | Alstad et al. . |
| 3,971,038 | 7/1976 | Myer . |
| 4,059,829 | 11/1975 | Kinsner et al. . |
| 4,079,429 | 3/1978 | Travot et al. . |
| 4,365,310 | 12/1982 | Green . |
| 4,442,350 | 4/1984 | Rashleigh .......................... 324/244.1 X |
| 4,450,406 | 5/1984 | Bobb ................................ 324/244.1 X |
| 4,482,400 | 11/1984 | O'Handley . |
| 4,491,867 | 1/1985 | Huignard . |
| 4,563,646 | 1/1986 | Désormière ........................... 324/244.1 |
| 4,564,289 | 1/1986 | Spillman, Jr. ..................... 324/244.1 X |
| 4,604,577 | 8/1986 | Matsumura et al. .................. 324/244.1 |
| 4,609,871 | 9/1986 | Bobb .................................... 324/244.1 |
| 4,618,901 | 10/1986 | Hatakeyama et al. . |
| 4,627,298 | 12/1986 | Sahashi et al. . |
| 4,634,977 | 1/1987 | Lenz et al. . |
| 4,658,148 | 4/1987 | Naito .................................. 324/212 X |
| 4,742,300 | 5/1988 | Lenz et al. . |
| 4,762,008 | 8/1988 | Kobayashi et al. . |
| 4,782,705 | 11/1988 | Hoffmann et al. . |
| 4,806,858 | 2/1989 | Elbicki .............................. 324/226 X |
| 4,816,761 | 3/1989 | Josephs ................................... 324/212 |
| 4,896,103 | 1/1990 | Shimanuki et al. ............. 324/244.1 X |
| 4,920,806 | 5/1990 | Obama et al. . |
| 4,922,200 | 5/1990 | Jackson et al. .......................... 324/223 |
| 4,925,742 | 5/1990 | Sugawara et al. . |
| 4,931,634 | 6/1990 | Toyama ................................. 324/244.1 |
| 4,939,937 | 7/1990 | Klauber et al. . |
| 4,947,107 | 8/1990 | Doerfler et al. . |
| 5,031,236 | 7/1991 | Hodgkinson et al. . |
| 5,034,679 | 7/1991 | Henderson et al. . |
| 5,110,376 | 5/1992 | Kobayashi et al. . |
| 5,113,131 | 5/1992 | Cooper et al. ............................ 324/96 |
| 5,116,693 | 5/1992 | Liu et al. . |
| 5,142,227 | 8/1992 | Fish . |
| 5,144,846 | 9/1992 | Klauber et al. . |
| 5,146,790 | 9/1992 | Fish . |
| 5,150,350 | 9/1992 | Aikoh et al. . |
| 5,202,629 | 4/1993 | Seike et al. ........................... 324/244.1 |

OTHER PUBLICATIONS

Moog, E. R. et al., *Thickness And Polarization Dependence Of The Magnetooptic Signal From Ultrathin Ferromagnetic Films*, 1 Apr. 1989.

Prinz, G. A., et al., *IEEE Transactions On Magnetics*, vol. Mag–17, No. 6, Nov. 1981.

Krebs, J. J. et al., *IEEE Transactions On Magnetics*, vol. Mag–16, No. 5, Sep. 1980.

Oliver, S. A. et al., *Research in Microwave Materials*, Nov. 1990.

McKnight, S. W. et al., *Magneto–Optical Kerr Effect In Soft Magnetic Films For Optical Sensor Appliations*, Proposal to Charles Stark Draper Laboratories, Mar. 10, 1990.

(List continued on next page.)

*Primary Examiner*—Sandra L. O'Shea
*Assistant Examiner*—Warren S. Edmonds
*Attorney, Agent, or Firm*—Weingarten, Schurgin, Gagnebin & Hayes

[57] ABSTRACT

A sensor system including a magnetooptic sensing element, a light source, at least one polarizer and at least one detector disposed about the sensing element. The sensing element has a first characteristic such that the sensing element provides a response to an applied external stress.

19 Claims, 6 Drawing Sheets

OTHER PUBLICATIONS

Moslehi. B et al., *Optical Magnetic And Electronic Field Sensors Based On Surface Plasmon Polariton Resonant Coupling.*

Freiser, Marvin J., *IEEE Transactions on Magentics,* vol. Mag–4, No. 2, Jun. 1968.

Oliver, S. A. et al., *Research In Microwave and Magneto–Optic Materials,* Nov. 1991.

McKnight, S. W. et al., *Research in Microwave Materials,* May 1991.

Florczak, J. M. et al., *J. Appl. Phys.* 67(12):7520, 15 Jun. 1990.

Oliver, S. A. et al., *J. Appl. Phys.* 67:5019 (1990).

Bucholtz, F. et al., *SPIE vol. 1367 Fiber Optic and Laser Sensors VIII,* p. 226 (1990).

Bushnell, S. E. et al., *Rev. Sci. Instrum.* 63(3):2021, Mar. 1992.

Minden, H. T., *Rev. Sci. Instrum.* 63(2): 1798, Feb. 1992.

Nader–Rezvani, N. et al., *Optical Engineering* 31(1):23, Jan. 1992.

Vijai Kumar Agrawal, et al, Waveguide Type Optical Modulator Using Kerr Magnetooptic Effects in Ni–Fe Thin Films; Experimental Study Japanese Journal of Applies Physics, vol. 14, No. 9, Sep., 1975, pp. 1313–1322.

V. K. Agrawal, et al, Analysis of Hybrid Modes in an Optical Waveguide Bounded at One Side by a Gyromagnetic Medium, Optics Communication, vol. 16 No. 1, Jan., 1976, pp. 104–109.

Mark E. Re, et al, Magneto–Optic Determination of Magnetic Recording Head Fields, IEEE Transactions on Magnetics, vol. Mag–22, No. 5, Sep., 1986, pp. 840–842.

C. S. Guderman, D. E., et al, "Easy Axis Orientation Mapping of Soft Magentic Films Using A Magnetic–Optic Kerr BII Imager," IEEE Transactions on Magnetics, vol. 25, No. 5, Sep., 1989, pp. 4207–4209.

K. Abe, et al., Hc Measurement of Microscopic Regions on Thin Film Magnetic Disc Using Longitudinal Kerr Effect, IEEE Transactions on Magnetics, vol. 25, No. 5, Sep., 1989, pp. 4210–4212.

MAGNETO-OPTIC KERR EFFECT STRESS SENSING SYSTEM

This invention relates to transducers and more particularly to magnetooptic transducers.

BACKGROUND OF THE INVENTION

As is known in the art, a transducer is a device or apparatus that converts non electrical physical parameters into electrical signals (i.e. current or voltage signals) having a value proportional to the value of the physical parameter being measured. Typical transducers provide a variation in an electrical resistance, inductance, or capacitance in response to a change in some physical parameter to be measured.

For example, a strain gauge may be provided by disposing an foil or wire in a region in which strain is to be measured. The electrical wire or foil is provided from a piezoresistive material. Thus, a change in the length and or cross-sectional area (i.e. mechanical deformation) of the foil or wire produces a change in the electrical resistance of the foil or wire.

The resultant change in electrical resistance of the foil or wire corresponds to a particular strain. A corresponding electrical signal is subsequently fed via an electrical line, for example, from the foil or wire to a detector and electronics where the signal is detected and processed to provide an indication of the corresponding level of strain. Thus, by measuring the change in resistance of the foil or wire to a calibration level of the strain gauge, the strain within the region to which the strain gauge is attached may be determined.

One problem with this approach however, is that electrical signal paths are subject to sources of noise which in some applications render the measurement system unusable. Furthermore, in those applications in which electrical based devices are disposed in potentially explosive environments such electrical based devices may be hazardous to use.

SUMMARY OF THE INVENTION

In accordance with the present invention, a magnetooptic sensing system includes a light source for emitting a light and a first polarizer, disposed to intercept at least a portion of the emitted light, and for allowing light having a first predetermined polarization characteristic to pass therethrough. The sensing system further includes a magnetooptic sensing element, disposed to intercept and direct a portion of the light having the first polarization characteristic, a second polarizer, disposed to receive at least a portion of the light directed thereto from the magnetooptic sensor element and adapted to attenuate the intensity of light having the first polarization characteristic and a detector disposed to detect light having an intensity, a phase and a polarization provided by the first polarizer, the sensing element and the second polarizer. With this particular arrangement, a magnetooptic sensing system is provided. If the magnetooptic sensor element is provided as a magnetic field sensing element, then the magnetooptic sensing system may be provided as a magnetooptic magnetic field sensing system. On the other hand, if the magnetooptic sensor element is provided as a stress sensing element, then the magnetooptic sensing system may be provided as a magnetooptic stress sensing system. The magnetooptic sensing element may be provided from one or more layers of a ferrimagnetic or ferromagnetic material. Depending on the particular application, each of the magnetic layers may be provided having a relatively large or a relatively small magnetoelastic coupling characteristic and a particular saturation magnetostriction. Thus in those applications where the sensor element is disposed to provide a magnetic field sensor it would be desirable to provide the magnetic layers having a small saturation magnetostriction characteristic. On the other hand, in those applications in which the sensor element is disposed to provide a stress sensor, it would be desirable to provide the magnetic layers having a large saturation magnetostriction characteristic.

In accordance with a further aspect of the current invention, a sensor includes a flux concentrator which may be disposed about a magnetic field sensing element. With this particular arrangement, a sensor having a relatively high degree of sensitivity is provided. The sensor element may be provided as a magnetoresistance sensor, a magnetooptic sensor, or any other thin film sensor which is responsive to the application of a magnetic field in the plane of the sensor. The flux concentrator may preferably be provided from a thick multidomain film of a high permeability ferromagnetic element or alloy. The flux concentrator is provided having a shape such that the magnetic field flux lines around the flux concentrator are rerouted through the flux concentrator. Furthermore, the shape of a flux concentrator is provided such that the concentrated magnetic field flux lines emerge from the flux concentrator in such a fashion such that the sensor is immersed in an enhanced, uniform magnetic field. The flux concentrator may be planar or three dimensional, and may be provided by techniques including but not limited to thin film deposition techniques and machining. The particular shape of the flux concentrator may be dependent upon the particular application, and may be determined by well known magnetostatics calculation techniques. The net enhancement in the magnetic field at the sensor location, relative to the ambient magnetic field, will be determined by factors including but not limited to the size and shape of the flux concentrator, and the permeability of the 18 constituent element or alloy which provide the flux concentrator and the sensor. The flux concentrator may be used in those magnetooptic magnetic field sensor applications requiring a high degree of sensitivity. In such applications the flux concentrator may be provided from a high permeability film such as an iron-nickel alloy. In this case, the presence of the flux concentrator increases the sensitivity of a measurement system by increasing the total magnetic field strength at the sensing element location relative to the ambient magnetic field environment.

In accordance with a still further aspect of the invention, a sensor includes a magnetic shield disposed about a stress sensing element. The magnetic shield is provided for minimizing extraneous magnetic field lines from a plane in which the sensing element is disposed. With this particular arrangement, a stress sensing element is provided. The magnetic shield may be provided from a relatively thick film of a ferromagnetic element or alloy having a relatively high permeability. The magnetic shield may be provided having a shape selected to direct external magnetic fields away from the sensor and to minimize magnetic fields at the sensing element arising from surface magnetic poles in the magnetic shield.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figure 1:
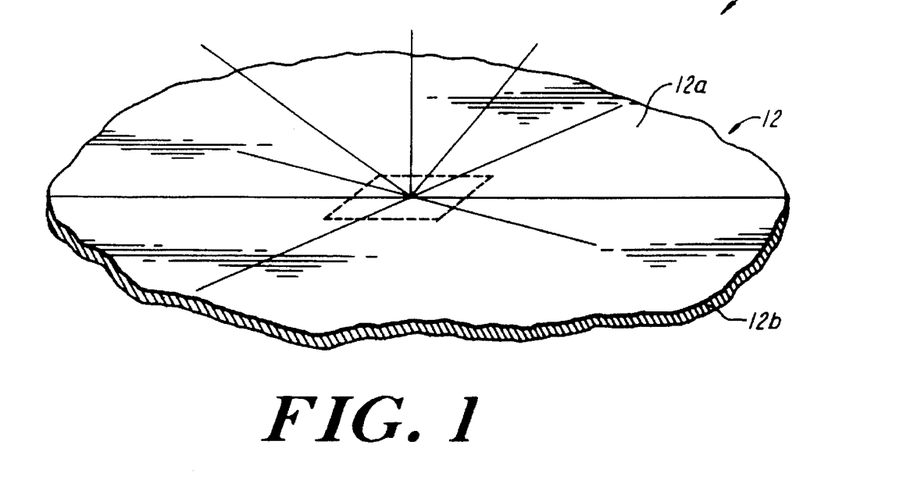
FIG. 1 is an isometric view of a magnetooptic sensing element.

Referring now to FIG. 1, a magnetooptic sensing element 10 is provided as a magnetic thin film 12 having first and second opposing surfaces 12a, 12b. The magnetic thin film 12 is here provided from a single layer of a ferromagnetic or ferrimagnetic material having a thickness typically in the range of about 5 nanometers (nm) to 500 nm.

The magnetic layer 12 may be provided such that the total magnetic free energy of the layer is anisotropic with respect to the orientation of the magnetization vector in the larger plane. This anisotropic total magnetic free energy dependence on magnetization orientation can be described by assuming the presence of a (fictitious) in-plane uniaxial anisotropy field. Here the magnetic layer may be provided with a small, spatially homogeneous in-plane uniaxial anisotropy.

The presence of the in-plane uniaxial anisotropy field defines an axis along which a magnetization vector of the magnetic layer 12 lies prior to the application of an external stimuli to be measured. This axis is generally referred to as a so-called "easy axis." Orthogonal to the easy axis is a so-called "hard axis" along which the toted magnetic field free energy is maximized, such that it is most energetically unfavorable for the magnetization to lie along the hard axis. The direction of the magnetization vector should not deviate from the easy axis unless external stimuli are applied to the magnetic layer 12 at an angle relative to the easy axis as will be described further below and in conjunction with FIGS. 3 and 7–9.

The magnetic layer 12 is provided having a particular thickness selected such that a demagnetizing and if present uniaxial anisotropy field perpendicular to the film plane confine the film magnetization into the plane of the film 10. The magnetic layer 12 should also be provided such that should domain walls exist in the layer 12, they should preferably be confined to regions exterior to the section of the layer 12 upon which light is incident.

The orientation of the magnetization in the plane of the magnetic layer is responsive to application of external magnetic fields in the film plane, such that the film 10 may be disposed to provide a magnetic field sensor, for example. The orientation of the magnetization is also responsive to the application of planar stress through either film surface 12a, 12b, such that the film 10 may be disposed to provide a stress sensor. Such stress may include but is not limited to strain, torque and pressure.

If other film characteristics (e.g. magnetooptic constant, reflectivity, magnetostriction constant, film thickness, film composition, etc . . . ) are provided having predetermined values, the amount of rotation of the magnetization in the film plane with a fixed applied stimuli (magnetic field, stress, strain, torque, pressure, etc . . . ) depends upon the magnitude of the in-plane uniaxial anisotropy in the magnetic layer and the angle at which the stimuli is applied relative to the easy axis. The sensitivity of the sensor depends upon the degree of magnetization rotation for an incremental change in applied stimuli. Thus, a trade off may be made between sensor sensitivity and the range of a particular quantity which may be measured by the sensor. Such a trade off is made through the selection of a particular in-plane uniaxial anisotropy field.

For example if the film 10 is disposed to provide a magnetic field sensor, and the in-plane uniaxial anisotropy field is provided having a value of ten oesteds (Oe), then magnetic fields having a value greater than ten Oe will saturate a sensor provided from the film 10 and thus may not be measured. It should be noted that the provision of different in-plane uniaxial fields may provide such a sensor having optimum characteristics for different applications.

It would also be desirable for the film 12 to be provided having a large magnetooptic constant at the operational wavelength. A film having a large magnetooptic constant provides relatively large magnetooptic Kerr effects upon reflection of a polarized incident light. The sensitivity of an optical detection system (not shown) increases with the magnetooptic constant, if all other film characteristics and stimuli are held constant.

It is further desirable that the reflectivity of the film 10 be large at the operational wavelength, in order to maximize the intensity of the reflected light. As will be described further below, optimizing the total sensitivity of a sensor system may involve trade offs between the film 10 having a high reflectivity and a large magnetooptic constant.

Furthermore, depending on the particular application it may be desirable to provide the magnetic layer 12 having either relatively large or relatively small magnetoelastic coupling characteristics. More importantly, however, is the selection of a magnetic layer having a particular saturation magnetostriction constant.

When the magnetic layer 12 is provided having a relatively small saturation magnetostriction constant a sensing element relatively insensitive to applied planar stress (e.g. strain, torque, pressure) is provided. Thus, in applications where the sensing element is disposed to provide sensitivity to applied magnetic fields as a magnetic field sensor it would be desirable to provide the magnetic layer 12 with a relatively small saturation magnetostriction characteristic typically less than about $10 \times 10^{-6}$.

However, in applications where the sensing element is disposed to provide an indication of external stimuli in the form of planar stress (e.g. strain, torque, or pressure), it is desirable that the magnetic layer 12 have a relatively large saturation magnetostriction characteristics typically greater than $25 \times 10^{-6}$. Thus it is desirable that the magnetic layer 12 have large saturation magnetostriction when the sensing element is employed as a stress sensor to sense for example forces such as strain, torque, or pressure.

The magnetic layer 12 may be provided from a combination of iron and boron or alternatively the magnetic layer may be provided from a combination of iron, nickel, boron, and silicon. It should be noted however, that the magnetic layer 12 may also be provided from materials including but not limited to members from the Transition Metal Series, the Lanthanide Series, and Groups III, IV, and V from the Periodic Table of Elements. Preferred elements from which magnetic layers may be provided include iron (Fe), cobalt (Co), nickel (Ni), boron (B), silicon (Si), carbon (C), phosphorus (P), germanium (Ge), nitrogen (N), aluminum (Al), chromium (Cr), copper (Cu), zirconium (Zr), and gadolinium (Gd). Other preferred elements include lanthanum (La), cerium (Ce), yttrium (Y), gallium (Ga), silver (Ag), palladium (Pd), platinum (Pt), gold (Au), vanadium (V), molybdenum (Mo), niobium (Nb), tin (Sn), hafnium (Hf), titanium (Ti), tantalum (Ta), ruthenium (Ru), manganese (Mn), neodymium (Nd), terbium (Tb), dysprosium (Dy), holmium (Ho), samarium (Sm), and europium (Eu).

Figure 1A:
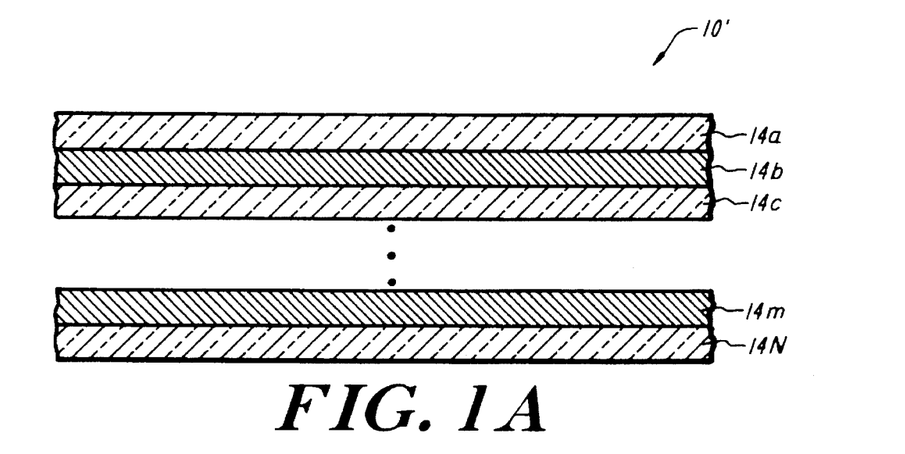

Referring now to FIG. 1A, a magnetooptic sensing element 10' is here provided from a magnetic thin film having a plurality of layers 14a–14N. At least one of the plurality of layers 14a–14N should be provided from a ferromagnetic or ferrimagnetic material having a thickness, composition, magnetization orientation, magnetooptic constant, reflectivity, and magnetostriction constant selected in accordance with the parameters discussed above in conjunction with FIG. 1.

The magnetooptic sensing element 10' may be provided such that several layers of magnetic material may be disposed one over another, interspaced by one or more dielectric spacing layers. Here, for example, layers 14a, 14c and 14N may be provided as nonmagnetic layers while layers 14b and 14m may be provided as magnetic layers. Alternatively, layers 14a, 14c and 14N may be provided as magnetic layers and layers 14b, 14m may be provided as non magnetic layers. The nonmagnetic layers are generally provided having a thickness typically in the range of about 1 nm to 400 nm.

Another alternative may be to provide two contiguous layers from magnetic material and provide the remaining layers from non magnetic materials. For example, assuming the sensor 10' is provided having four layers, then layer 14a may be provided from a non magnetic metal, layer 14b may be provided as $Fe_{20}Ni_{80}$, layer 14c may be provided as $Fe_{80}B_{20}$ and layer 14m may be provided as a dielectric material upon which light may be incident.

Each of the layers 14a–14N which are provided as magnetic layers may of course be provided from the elements listed above in conjunction with FIG. 1. The nonmagnetic layers may be provided from metallic, dielectric, or semiconducting materials, selected to enhance the reflectivity of the film, or the adhesion of the film to a substrate (not shown), using techniques well known to those of ordinary skill in the art.

Figure 1B:
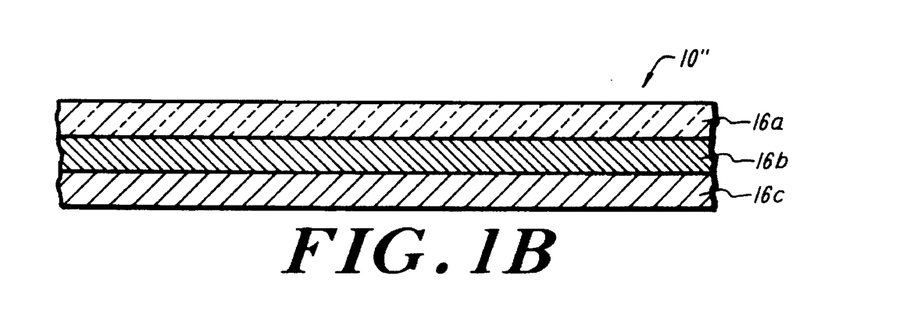

Referring now to FIG. 1B, a magnetooptic sensing element 10" is provided having an inner magnetic layer 16b disposed between a pair of outer layers 16a, 16c. The outer layer 16a may be provided from a dielectric material and the outer layer 16c may be provided from a dielectric or metal material. The outer layer 16c may be provided from a metal or semi conductor material to dissipate heat energy provided by the magnetic layer 16b for example.

Figure 2:
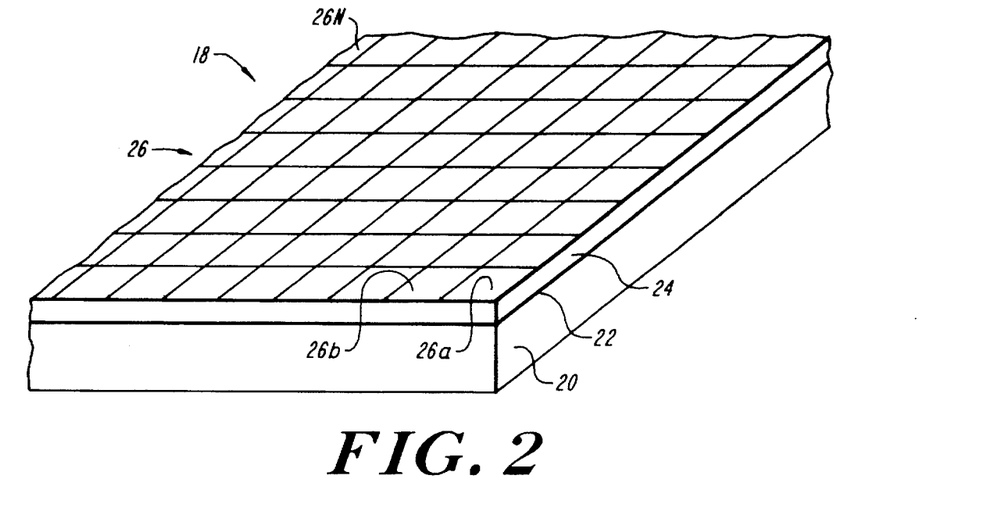
FIG. 2 is an isometric view of a magnetooptic sensing element.

Referring now to FIG. 2, a sensor 18 may be provided as an array 26 of sub-elements 26a–26N provided by dividing a magnetic film 24 into a plurality of disconnected subdivisions, each of such sub-divisions corresponding to one of the sensor sub-elements 26a–26N. The magnetic film 24 may be provided as a single layer film or a multilayer film as described above in conjunction with FIGS. 1–1B.

The sub-elements 26a–26N are preferably provided having planar disc or elliptical shapes. However rectangular or other shapes may also be used as long as no demagnetizing fields are generated which affect the desired magnetization behavior described above in conjunction with FIG. 1. Furthermore, the sub-elements need not be of equal size.

Here, the sub-divided film is shown disposed on a first surface 22 of a substrate 20. The substrate 20 may be provided from any material such as glasses, transparent dielectrics, plastic, metal, semiconductor materials and any other material well known to those of ordinary skill in the art. The film 24 and thus the sensing element 18 may be disposed over the substrate 34 using conventional deposition, patterning and lithographic techniques. The substrate 20 may correspond to a device under test, or alternatively the substrate 20 with the film 24 disposed thereon may be mounted on a device under test or at a position under test.

The sensors 26 may be conformally disposed on a surface having a predetermined shape. Thus, although the film 24 is here shown disposed over a substrate 20 having a flat surface, the substrate 20 could alternatively have been provided having a curved surface over which the film 26 may be disposed. The film 26 may be disposed over such a curved surface provided that the film retains the characteristics of having good adhesion to the substrate, uniform anisotropy fields and demagnetizing fields which confine the film magnetization in the film plane and with a homogeneous predetermined magnetization orientation throughout the film 26, and a uniform response to the external stimuli. Thus, regardless of the shape of the surface on which the film 26 is disposed the magnetization should be oriented such that the sensor 18 provides substantially the same response everywhere on the sensing element for a uniform stimulus. These conditions are also desirable when the sensor film 26 is provided as a non-subdivided film 10 as shown in FIG. 1.

Figure 3:
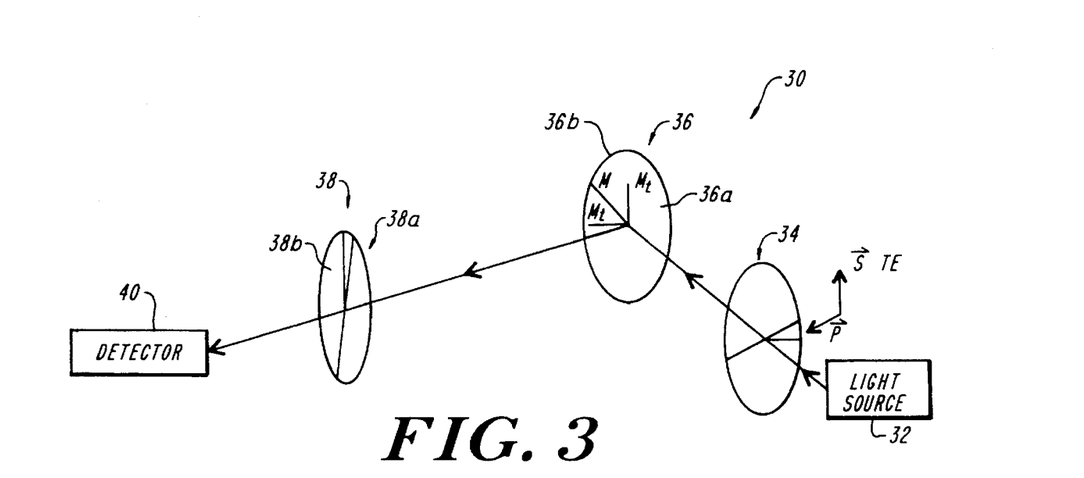
FIG. 3 is a schematic diagram of a magnetooptic sensing system.

Referring now to FIG. 3, a magnetooptic sensing system 30 includes a light source 32 which may be provided, for example, as a helium-neon (HeNe) laser operating at 0.63 microns, a laser diode, a light emitting diode, or any other quasi-monochromatic light well known to those of ordinary skill in the art. The light source 32 emits light which is transmitted toward a first surface of a polarizer 34 which allows light having a first predetermined polarization to pass therethrough.

The light which passes through the polarizer 34 is thereafter incident upon a sensing element 36 which may be provided as a magnetic field sensing element or a stress sensing element in accordance with techniques described above in conjunction with FIG. 1. The sensing element 36 is provided having first and second opposing surfaces 36a, 36b. The polarized light is incident on the first surface 36a of the sensing element 36.

The incident light preferably illuminates a single magnetic domain (not numbered) of the sensing element 36. At least a portion of the light is then reflected from the surface of the sensor film towards a first surface 38a of a second polarizer 38.

The polarizer 38 is here adapted to attenuate the intensity of light having the first polarization characteristic. The polarization characteristics, denoted as either transverse electric polarization (s-polarized light) or transverse magnetic polarization (p-polarized light), are defined by the orientation of the light plane of incidence relative to the plane of the sensing element 36. Light which is reflected off of the sensing element 36 may have a rotation of polarization relative to the incident light. This rotation of polarization effectively converts a fraction of one polarization to the other by an amount given by the off-diagonal elements of the Jones matrix for the sensing element 36. The amount of polarization conversion is dependent upon the orientation of the magnetization in the magnetic layer or layers relative to the plane of incidence of the transmitted beam from the first polarizer 34 to the sensing element 36. Thus light having an intensity, a phase and a polarization provided by the first polarizer 34, the sensing element 36 and the second polarizer 38 is transmitted to a detector 40.

The detector 40 may be provided as a semiconductor diode, a photomultiplier tube or as any other type of detector well known to those of ordinary skill in the art.

The transmission of light from the light source 32 to the detector 40 may be through the atmosphere, or alternatively through guided wave media or alternatively still through a combination of the atmosphere and guided wave media. Such guided wave media may be provided for example as a fiber optic cable, or a channelled optical device. Requirements on the transmission characteristics (e.g. polarization maintaining, single mode, multimode, etc . . . ) of the guided wave media should be selected in accordance with the particular application desired and the section of the transmission path which the guided wave media would provide.

The dependence of the system sensitivity on the polarization characteristics of light may be more easily explained by considering a special case in which only one polarization component is incident upon the sensing element 36. The first polarizer 34 may thus be adjusted such that only light having a transverse electric field (TE or s-polarized light) component is incident on the sensing element 36.

The polarization characteristics for light specularly reflected from the sensing element 36 may be analytically determined by applying the so-called Jones matrix for the sensing element 36 to the analogous matrix for the initial polarized light. The Jones matrix allows a full description of the optical response of the sensing element 36, including the Kerr magnetooptic effects.

Continuing the special case, if the component of the magnetization vector for the magnetic film layer(s) (not shown) that lies in the plane of incidence of the light is non-zero, a small component of the incident s-polarized light will be converted to p-polarized light (transverse magnetic or TM) upon reflection. If the second polarizer 38 is then adjusted such that only p-polarized light is permitted transmission, a non-zero light intensity will be measured at the detector 40. This configuration of polarizer orientations is generally referred to as "crossed polarizers".

Thus the amount of polarization conversion, and hence detector signal, is proportional to the magnitude of the magnetization in the plane of incidence. Since the magnetization component depends upon the magnitude and orientation of the uniaxial anisotropy in the magnetic layer(s) of the sensor 36, and the orientation and magnitude of the external stimuli, this procedure forms the basis of the sensor system 30.

The signal to noise ratio of the sensor system 30 may be increased through the by using a homodyne coherent detection scheme. Such a detection scheme may be employed through adjustment of the orientations of the two polarizers 34, 38 relative to the "crossed polarizer" settings described above. The first polarizer 34 is adjusted such that it transmits primarily one polarization, but with a small "leakage" component of the second polarization. Upon reflection from the sensing element 36 the amplitude and phase of both light polarizations will be modified in a manner defined by the Jones matrix for the sensing element 36, which includes the orientation of the magnetization in the magnetic layer(s) relative to the plane of incidence of the light. At this point a mixing of electric field amplitudes occurs between the small signal amplitude converted from the primary polarization component and the polarization component "leaked" through the first polarizer 34. This "leakage" electric field amplitude provides the local oscillator signal in the homodyne coherent detection scheme, providing a net gain in signal intensity at the detector 40.

Conventional homodyne sensors use two separate optical paths. In the present invention signals having both polarizations follow the same optical path. Sources of external noise which affect one polarization component will similarly affect the other component, so as to minimize the total noise contributions along the optical path. This results in a signal having a greater signal-to-noise ratio than a signal provided by the "crossed polarizer" implementation. For all implementations the signal-to-noise ratio increases with increasing light source optical power at the operational wavelength. There are also few constraints on the coherence of the source 32.

Figure 4:
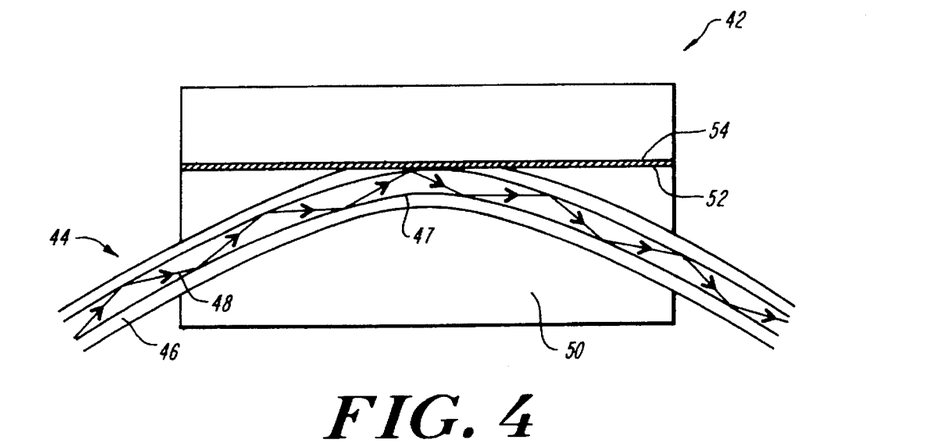
FIG. 4 is a sensor which may be of the type used in the sensing systems of FIGS. 7 and 9–11.

Referring now to FIG. 4, light 48 incident on a sensing element 52 is propagated through a fiber optic cable 44. The cable 44 is here disposed on a dielectric block 50 to provide a so-called fiber optic coupler block half 42. A portion of the fiber optic cable cladding 46 has been removed to expose a fiber optic cable core 47 at the apex of curvature such that at least a portion of the light 48 propagating through the fiber optic cable 44 may be exposed to the sensing element 52 which has been disposed on either the fiber optic coupler block half 50 containing the fiber, or the opposing coupler block half 54 which is placed surface to surface with the coupler half 50 containing the fiber optic cable 44. In either case the coupler block half which has the sensing element 52 disposed thereon is considered the substrate, and the area of the sensing element 52 exposed to the light should remain single domain during standard sensor operating conditions.

Figure 5:
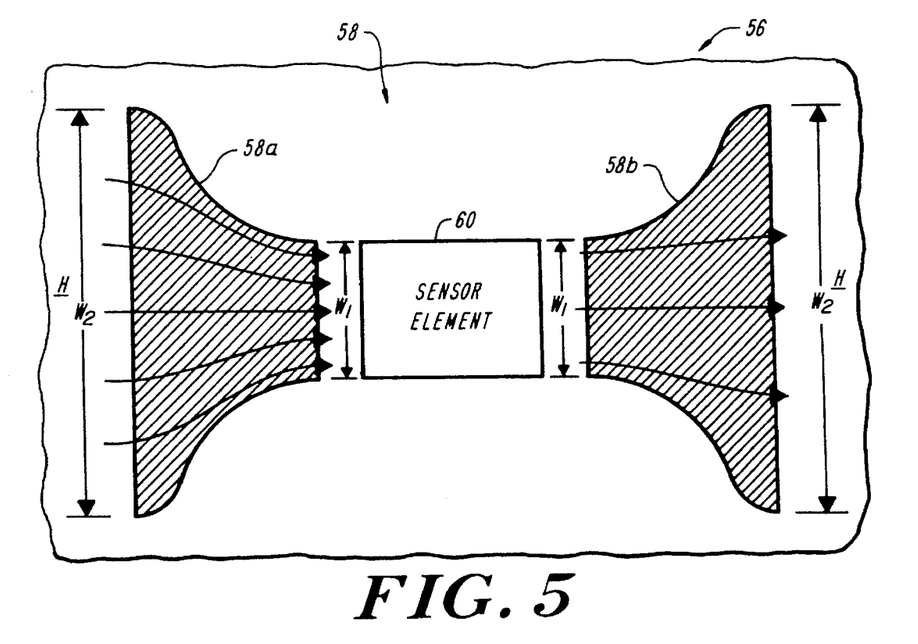
FIG. 5 is a sensor including a flux concentrator disposed about a sensing element.
Figure 5A:
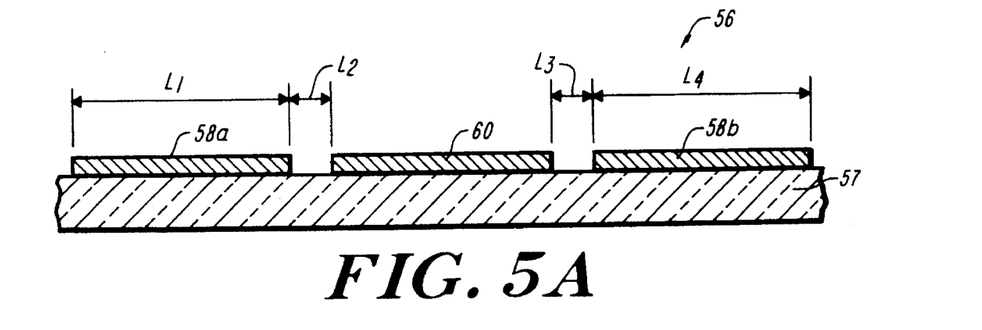
FIG. 5A is a cross sectional view of the sensor of FIG. 5.

Referring now to FIGS. 5 and 5A, a sensor 56 includes a flux concentrator having portions 58a, 58b generally denoted 58 disposed about a magnetic field sensor element 60. The sensor 60 may be provided as a magnetoresistance sensor, a magnetooptic sensor or any other sensor responsive to the application of a magnetic field in a plane in which the sensor 60 is disposed. The flux concentrator 58 is preferably provided from a multidomain film having a thickness typically in the range of about 0.5 microns to 10 microns.

The film should include at least one layer provided from a ferromagnetic element or alloy having a relative permeability typically in the range of about 200 to 5000.

The flux concentrator 58 is provided having a shape such that the magnetic field flux lines around the flux concentrator 58 are directed through the flux concentrator 58. Furthermore, the shape of the flux concentrator 58 may be selected such that concentrated magnetic field flux lines emerge from the flux concentrator 58 such that the sensor 60 is immersed in an enhanced, uniform magnetic field. The flux concentrator 58 may be planar or three dimensional, and may be provided by film deposition techniques, machining, or any other technique well known to those of ordinary skill in the art. The particular shape of the flux concentrator 58 may depend upon the particular application, and may be determined by well known magnetostatics calculation techniques. The net enhancement in the magnetic field in the location at which the sensor 60 is disposed, relative to the ambient magnetic field, generally is dependent on the size and shape of the flux concentrator 58, and the permeability and other magnetic parameters of the constituent element or alloy.

The flux concentrator 58 may be advantageous in magnetooptic magnetic field sensor applications requiring a high degree of sensitivity. In such applications the flex concentrator 58 may be provided from a high permeability film such as iron. In this case, the presence of the flux concentrator 58 increases the sensitivity of a system by increasing the total magnetic field strength at the sensing element location relative to the ambient magnetic field environment.

The flux concentrator 58 is here provided having a generally triangular shape with curved side edges as shown. The flux concentrator portions 58a, 58b may be provided having lengths $L_1$, $L_4$ typically in the range of about 1 millimeter (mm) to 50 mm. The lengths $L_1$ and $L_4$ need not be equal. Each of the flux concentrator portions 58a, 58b are spaced from the sensor element 60 by distances $L_2$ and $L_3$ typically in the range of about 0.01 mm to 2 mm. A particular selection of distances $L_1$–$L_4$ may be made based upon a variety of factors including but not limited to the characteristics of the material from which the flux concentrator 58 and the sensor element 60, are made. For example the thickness and permeability characteristics of the material are two factors which may be used to select appropriate values for the distances $L_1$–$L_4$.

The width $W_1$ of the flex concentrator is dependent upon the width of the corresponding side of the sensor element 60. The width $W_1$ is generally provided a minimum of three times the width of the sensor element 60. The width $W_1$ is a function of the length $L_2$ such that the smaller the distance $L_2$, the closer the width $W_1$ becomes to the minimum width of three times the sensor element width. The width $W_2$ is selected to provide a particular gain characteristic for a planar device as shown. Gain is provided as the ratio of $W_2$ to $W_1$.

Figure 6:
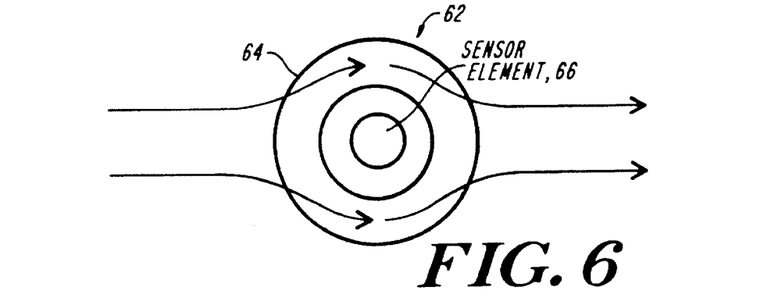
FIG. 6 is a sensor including a magnetic shield disposed about a sensing element.
Figure 6A:
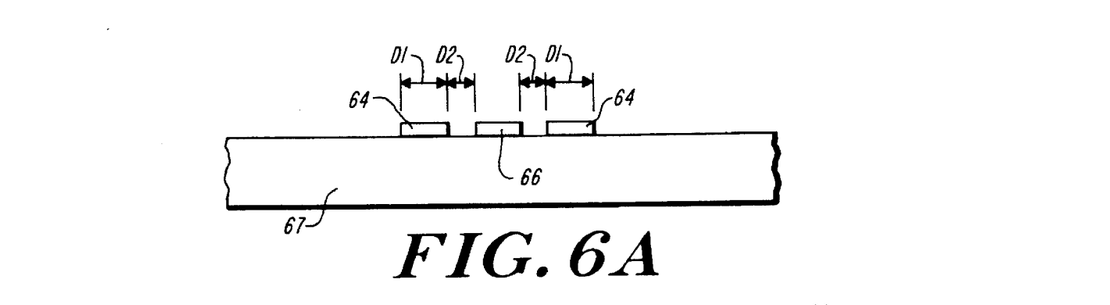
FIG. 6A is a cross sectional view of the sensor of FIG. 6.

Referring now to FIGS. 6 and 6A, a sensor 62 includes a magnetic shield 64 disposed about a sensor element 66 to increase the signal-to-noise ratio of a signal generated in response to a measurement of an applied stress (e.g. strain, torque, pressure, etc . . . ) through the screening of extraneous magnetic field lines from the plane in which the sensing element 66 is disposed. The magnetic shield 64 may not generally screen magnetic fields normal to the plane in which the sensing element 66 is disposed. However, such magnetic fields do not generally affect the magnetization orientation of the magnetic layer(s) in the sensing element unless such fields have a magnitude which is relatively large compared with the magnitude of the demagnetizing field normal to the film layer.

For example, if a magnetic layer of the sensor 66 is provided from Fe and B, the demagnetizing field may be provided having an amplitude typically of about 12,000 Oersteds (Oe). Thus, a significant field normal to the plane in which the sensing element is disposed may have an amplitude typically in the range of 10 Oe to 100 Oe.

The magnetic shield 64 may be provided from a thick film of a ferromagnetic element or alloy having a relative permeability typically in the range of about 200 to 5000. The magnetic shield 64 may be provided having any shape, including but not limited to elliptical shapes other than the circular shape hereshown, selected to minimize the effects of any magnetic fields at the sensing element 66 arising from surface magnetic poles of the magnetic shield surface facing the sensor element 66.

The magnetic shield 64 is here provided having an annular ring shape. The shield 64 is provided having a ring width $D_1$ typically in the range of about 0.1 millimeters (mm) to 5 mm and is spaced from the sensor element 66 by a distance $D_2$ typically in the range of about 0.01 mm to 2 mm. A particular selection of distances $D_1$ and $D_2$ may be made based upon a variety of factors including but not limited to the characteristics of the material from which the shield 64 and the sensor element 66, are made. For example the thickness and permeability characteristics of the material are two factors which may be used to select appropriate values for the distances $D_1$ and $D_2$.

Figure 7:
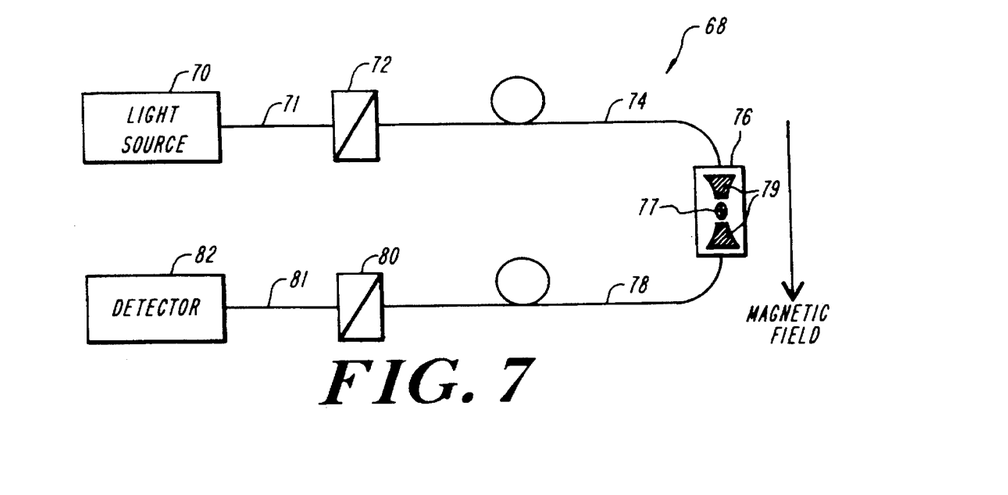
FIG. 7 is a block diagram of a magnetic field measurement system.

Referring now to FIG. 7 a magnetic field measurement system 68 includes a single optical path between a light source 70 and a detector 82. The system 68 is here provided using fiber optic and other guided wave components. The system includes a light source 70 which transmits light along a first fiber optic cable 71 to a first polarizer 72. The polarization of the light transmitted through the first polarizer 72 is determined by the detection scheme to be applied and the desired signal-to-noise ratio. Polarized light is coupled from the polarizer 72 through a fiber optic cable 74 and is incident upon a sensor 76. The sensor 76 includes a sensor element 77 which may be disposed on a fiber optic coupler block half in the manner describe above in conjunction with FIG. 4.

The sensor 76 may optionally include flux concentrators 79, as described above in conjunction with FIG. 5, disposed about the sensor element 77 to enhanced sensitivity to a magnetic field. The coupler block half/substrate/sensing element sensor 76 has been previously positioned on the object or at the location where the external magnetic field is to be measured, such that the magnetic field lies in the plane of incidence of light and in the plane of the sensing element 77.

In this embodiment it is desirable that there be no polarization conversion when the external magnetic field is zero. This may be accomplished by providing the sensing element 77 such that the hard axis of the magnetic layer(s) which provide the sensing element 77 lies in the plane of incidence of light, such that the magnetization lies transverse to the plane of incidence when no external stimuli is present. This arrangement provides the desired result since there is no magnetization vector component in the light plane of incidence, and hence no polarization conversion.

As described above, the magnetic layers which provide the sensor element 77 may be provided having small saturation magnetostriction constants such that the effects of external stress (strain, torque, pressure) do not cause a change in the orientation of the magnetization vector. The predetermined orientation of the sensing element 77 and plane of light incidence is such that the external magnetic field to be measured is oriented predominately along the axis defined by the plane of incidence and the film plane (which is also along the axis defined by the maximum in-plane uniaxial anisotropy field, the so-called "hard" axis).

The presence of an external magnetic field oriented along the "hard" axis will cause a rotation of the magnetization in the magnetic layer(s) towards the "hard" axis, by an amount determined by the magnitude of the external magnetic field and the magnitude of the in-plane uniaxial anisotropy field. This magnetization rotation causes a change in the optical properties of the sensing element 77, as described by the Jones matrix.

In particular, this arrangement is such that no polarization conversion occurs when the magnetization lies transverse to the "hard" axis, i.e. when the external magnetic field is zero. This case corresponds to the transverse magnetooptic Kerr effect. On the other hand, a maximum amount of polarization conversion occurs when the magnetization lies along, or close to, the "hard" axis, corresponding to the so-called longitudinal magnetooptic Kerr effect. Hence the rotation in magnetization orientation caused by the presence and magnitude of the external magnetic field produces a change in the polarization characteristics of the reflected light from the sensing element.

Magnetic flux concentrators 79 may also be employed so as to increase the magnetic field at the sensing element location relative to the ambient magnetic field. This will enhance the amount of magnetization rotation and hence the total polarization conversion.

Light specularly reflected from the sensor 76 is transmitted along a fiber optic cable 78 to a second polarizer 80. As mentioned above, in conjunction with the crossed polarizer and the optical homodyne coherent detection, the light transmitted through the polarizer 80 is modified according to the application and the detection scheme employed.

Light transmitted through the second polarizer 80 is then coupled along a fiber optic cable 81 to a detector 82. The optical detector 82 converts the total optical power to a detector current. The detector current may then be modified through amplification, phased loop lock detection, etc. or through other electronics techniques well known to those of ordinary skill in the art. Finally, the modified current is presented in such a form that the 14 external magnetic field at the sensor location may be determined.

It should be noted that the particular embodiment of the magnetic field sensor system 68 may be equally well implemented for the measurement of stress (strain, torque, pressure) by replacing the magnetic field sensing element 77 with a stress sensing element 77', eliminating the optional flux concentrator 79 and adding a magnetic shield 79' if desired. An example of what such an element would entail is described below in conjunction with FIG. 8, Referring now to FIG. 8, a magneto-optic stress (e.g. strain, torque, pressure, etc . . . ) sensing system 84 includes a light source 86 which directs a light beam toward a polarizer 88. The light source 86 and polarizer 88 may be similar to the light source and polarizer described above in conjunction with FIGS. 3 and 7.

Figure 8:
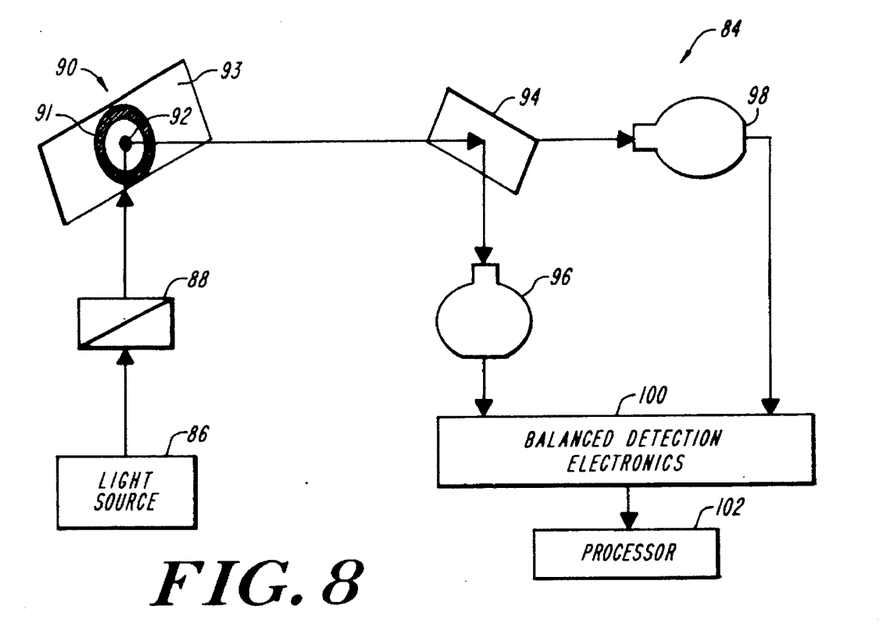
FIG. 8 is a block diagram of a magnetooptic stress sensing system.

Here, light having a predetermined polarization defined by polarizer 88 is incident upon a sensor 90. The sensor 90 here includes an optional magnetic shield 91 disposed about a stress sensing element 92. The sensor 90 is here diagrammatically shown in perspective view to more easily view the magnetic shield 91 and sensing element 92. In practice of course the sensor 90 should be disposed such that the sensing element appropriately reflects light fed from the polarizer 88 toward polarizer 94.

The sensing element 92 (and optional magnetic shield 91 if provided) has been previously deployed on an object 93 or at the location under test. The sensing element 92 (and magnetic shield if present) may have been provided on the object through thin film deposition techniques. Alternatively, the sensing element 92 (and magnetic shield if present) may be mounted on the object 93 using adhesives having sufficient strength and stiffness such that the stress (strain, torque, pressure) is transferred as accurately as possible from the test object 93 to the sensing element 92 and any corresponding substrate. Well known techniques and adhesives used for mounting strain gauges may be employed in the mounting of the stress (strain, torque, pressure) sensing element 92 and substrate.

The sensing element 92 is provided from magnetic layer(s) having a relatively large saturation magnetostriction constants typically in the range of about $25 \times 10^{-6}$ to $60 \times 10^{-6}$. In those applications where the desired stimuli to be measured is uniaxial stress or the analogous strain, torque, or pressure stimuli, the sensing element 92 may be provided by locating the "hard" axis of the magnetic layer(s) at a 45 degree angle relative to the light plane of incidence. The magnetization orientation, for no applied external stimuli, will thus lie transverse to the "hard axis" and also at 45 degrees relative to the light plane of incidence. For this case the sensing element 92 is positioned such that the uniaxial stress lies in the light plane of incidence. Application of external tensile (compressional) stress along this axis will create another in-plane uniaxial anisotropy field through the so-called inverse magnetostriction effect, causing a rotation of the magnetization towards or away from the light plane of incidence by an amount dependent upon the external uniaxial stress, the saturation magnetostriction constant of the magnetic layer(s), and the in-plane uniaxial anisotropy. Thus, providing the magnetic layer(s) with predetermined uniaxial anisotropy and saturation magnetization constants will determine the amount of magnetization rotation for an incremental change in stress (strain, torque, pressure) transferred from the object to be measured to the sensing element.

Light reflected specularly from the sensing element 92 is transmitted to a polarization splitter 94, which allows at least a portion of the incident light to pass therethrough, and reflects the remaining light. The polarization splitter 94 is oriented so as to mix primary and signal containing polarizations of the light signal in a predetermined manner. The primary polarization corresponds to the light polarization which is predominantly transmitted through the first polarizer 88. The signal containing polarization corresponds to the light polarization which is predominantly not transmitted through the first polarizer 88. The signal polarization also includes light which is converted from the primary polarization to this second polarization. Thus after mixing, each of the two light beams contains some signal information.

Each beam is transmitted to a respective one of detectors 96, 98, and converted to a detector current using any technique well known to those or ordinary skill in the art. The detector currents, each containing signal information, are then combined in a balance electronics circuit 100 in a manner generally referred to as balanced detection.

Balanced detection is a technique used in coherent (heterodyne or homodyne) detection. In particular, the technique is applied such that as the signal intensity at one detector increases the signal intensity at the other detector decreases. Detection of the difference between the two detector currents thus increases the net signal by a factor of two and reduces noise on the reference beam which is common to both channels through a method called common mode rejection. The resulting signal is then processed using standard electronic techniques.

The system 84 may be equally well used for the detection of magnetic fields. This is done by replacing the stress sensor 90 and magnetic shield 91 by a magnetic field sensor 90' (and flux concentrators if desired) which may be of the type described above in conjunction with FIG. 7 above.

Figure 9:
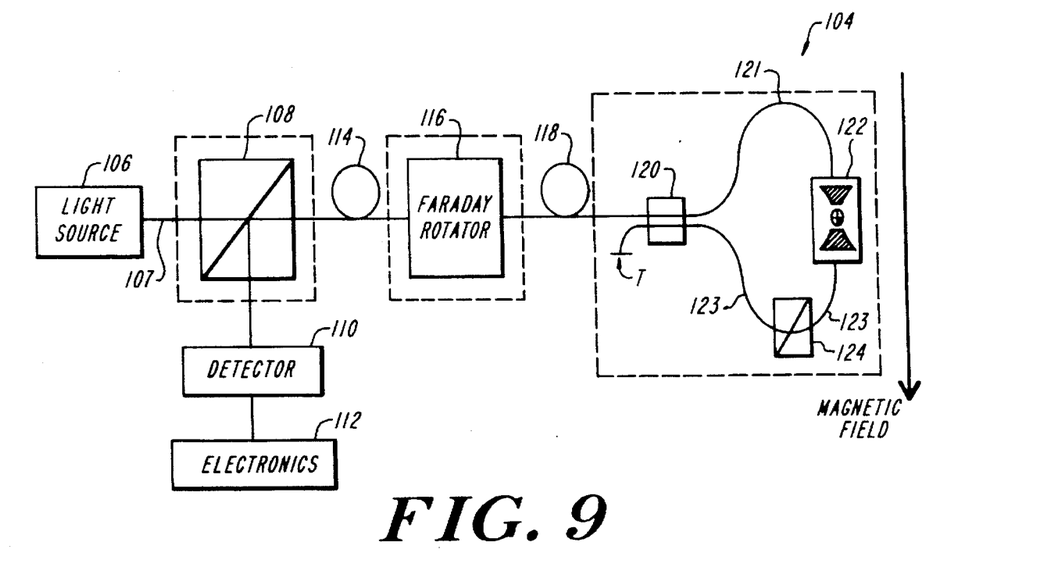
FIG. 9 is a magnetooptic magnetic field sensing system.

Referring now to FIG. 9, a magnetooptic magnetic field sensing system 104 includes an optical path provided by fiber optic cables 107, 114, 118 and 121 each of which may be provided as single mode polarization maintaining fiber optic cables or multimode fiber optic cables depending upon the particular application.

Light from a light source 106 transmitted through a polarization splitter 108, which passes light having a first polarization to the fiber optic cable 114 and to detector 110 and terminates light having a second different polarization. Such termination may be provided by absorbing the light or redirecting the light. The polarization splitter may alternatively be replaced by an optical coupler having polarization maintaining fiber.

The polarized light propagates along the optical fiber 114 to a Faraday rotator 116, which is necessary if coherent homodyne detection is being performed. However, the Faraday rotator 116 may be omitted in so-called crossed polarizer detection scheme. The Faraday rotator 116 provides a small amount of polarization conversion which may provide leakage light in the coherent homodyne detection scheme. In those systems in which homodyne detection is not used, the Faraday rotator may be replaced by an electrooptic modulator (not shown).

The light is coupled from the Faraday rotator 116 along a fiber optic cable 118 to an optical coupler 120 which may be provided having polarization maintaining fiber. The light is coupled from the coupler 120 to a sensor 122 through a fiber optic cable 121.

The sensor 122 here includes a sensing element 123 which may be provided for example as a magnetic field sensing element disposed on a coupler block half as described above in conjunction with FIG. 4. (or channeled guided wave block) at the location where a magnetic field is to be measured. The orientation of the sensing element plane, light plane of incidence, uniaxial anisotropy field, and external magnetic field may be selected as described above in conjunction with FIG. 7.

A polarizer 124 is disposed in a fiber optic cable 123 which is coupled between a second end of the sensor 122 and a third port of the fiber optic coupler 120. A fourth port of the coupler 120 is terminated in a load T to thus terminate, by absorption, signals fed thereto. Polarizer 124 is provided to preclude the transmission of the primary polarization through the sensor 122 in, here, the counter clockwise direction to thus prevent signals from cancelling at the coupler 120 due to the non-reciprocal response of the sensing element 122. In some applications it may be desirable to replace the polarizer 124 by providing the fiber optic cable 123 as a single polarization fiber optic cable.

Figure 10:
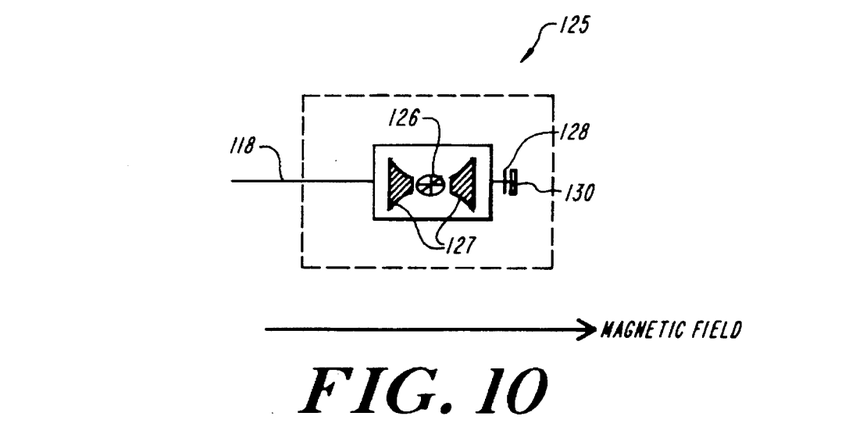
FIG. 10 is a magnetic field sensor.

Referring now to FIG. 10, a sensor 125 includes a sensing element 126 having an optional flux concentrator 127 disposed thereabout. Light which is specularly reflected from the sensing element is incident upon a phase shifting element 128 which may be provided for example as a quarter wave plate phase rotator or a Faraday rotator and a high reflectivity planar mirror 130, which causes the light to reverse path. The coupler 120, the sensor 122 and polarizer 124 may be replaced by the sensor 125. In this case the orientation of the sensing element 126 relative the external magnetic field is the same as described above in conjunction with FIG. 9.

If the phase shifter 128 is provided as a Faraday rotator, then light reflected from the mirror 130 and incident upon the Farraday rotator a second time will be reflected off the sensing element 126 a second time. In general, since the magnetooptic Kerr effect is non-reciprocal in nature the polarization conversion from the primary polarizer to the signal polarization would have a reversed sign for this return path, leading to a smaller total signal polarization. However, the use of the Farraday rotator may minimize this effect and may increase the total signal.

The sensors 122, 125 described above in conjunction with FIGS. 9 and 10 may be used as stress (strain, torque, pressure) measurement systems by omitting the flux concentrators, replacing the magnetic field sensing element by a stress sensing element, and including a magnetic shield if desired. For example, one embodiment which may be used for the stress sensing element can be that described above in conjunction with FIG. 8.

Figure 11:
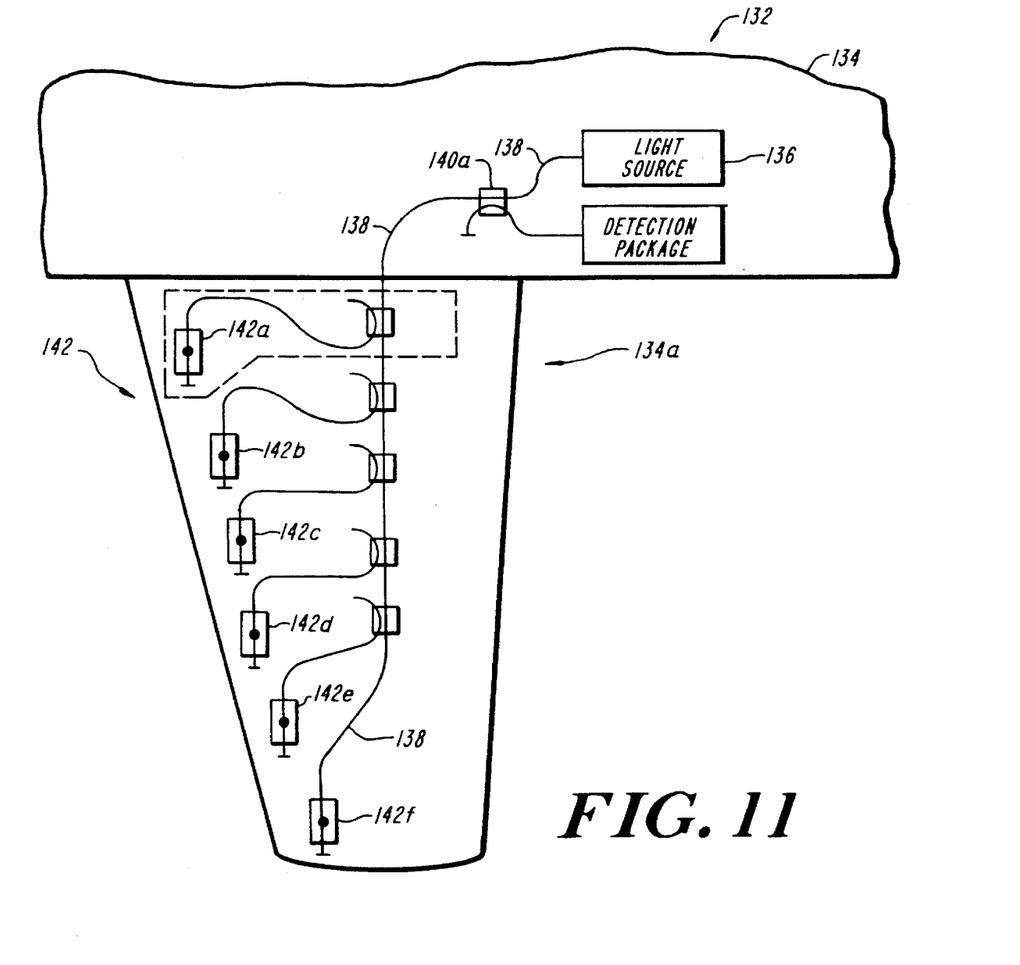
FIG. 11 is a magnetooptic stress sensing system having an array of sensors disposed on a vehicle.

Referring now to FIG. 11, a strain sensing system 132 disposed on a portion of a vehicle 134 includes a light source 136 feeding a beam of light through a fiber-optic cable 138 to a plurality of couplers 140a–140f generally denoted 140. Each of the couplers 140 couple a portion of the light provided from the light source 136 to a corresponding one of a plurality of sensor elements 142a 142f generally denoted 142.

The vehicle 134 may be provided as an aircraft and the portion of the aircraft on which the sensing system is disposed may correspond to an aircraft wing 134a for example. Thus the sensing system 132 here may provide a measure of a loading force on the aircraft wing 134a.

This arrangement provides a strain sensing system having the advantage of fiber-optics including low loss light guiding properties such that the source 136 may be separated a relatively large distance from the sensors 142. Furthermore this approach may provide a low cost approach to providing fiber-optic sensor systems. This may be especially true if the fiber-optic sensing devices 142 operate at a wavelength compatible with a fiber-optic communications networks for example and thus relatively inexpensive commercially available components may be used.

Having described preferred embodiments of the invention, it will now become apparent to one of ordinary skill in the art that other embodiments incorporating the concepts may be used. It is felt, therefore, that these embodiments should not be limited to disclosed embodiments but rather should be limited only by the spirit and scope of the appended claims.

What is claimed is:

1. A magneto-optic Kerr effect stress sensing system comprising:

a light source;

a magneto-optic Kerr effect stress sensor;

a polarizer disposed between said light source and said magnetooptic Kerr effect stress sensor wherein said light source directs a light beam toward said polarizer and said polarizer passes light having a first predetermined polarization said such that the light having the first predetermined polarization is incident upon said magneto-optic Kerr effect stress sensor;

a polarization splitter disposed to intercept light specularly reflected from said stress sensor wherein said polarization splitter passes at least a portion of the light incident thereon and reflects at least a portion of the light incident thereon wherein said polarization splitter is oriented to mix in a predetermined manner portions of the light signal having the first polarization with portions of the light signal having a second different polarization;

a first detector disposed to receive the portion of the light signal which passes through said polarization splitter; and a second detector disposed to receive the portion of the light signal which is reflected by said polarization splitter.

2. The sensing system of claim 1 wherein said magneto-optic Kerr effect stress sensor includes a plurality of layers wherein at least one of said plurality of layers is a magnetic thin film.

3. The sensing system of claim 1 further comprising a magnetic shield disposed about said magneto-optic Kerr effect stress sensor.

4. The sensing system of claim 1 wherein said magneto-optic Kerr effect stress sensor includes at least one magnetic layer having an in-plane uniaxial magnetic anisotropy and at least one magnetic domain having a magnetization that rotates coherently in response to an externally applied stress.

5. The sensing system of claim 4 wherein said at least one magnetic layer of said magneto-optic Kerr effect field sensor is provided from a magnetic thin film having at least one of:

a ferri-magnetic layer; and a ferro-magnetic layer.

6. The sensing system of claim 5 wherein said magneto-optic Kerr effect stress sensor further comprises a dielectric layer over which said thin film is disposed.

7. The sensing system of claim 6 wherein said magneto-optic Kerr effect field sensor includes at least one magnetic layer having a saturation magnetostriction constant in the range of $25 \times 10^{-6}$ to $60 \times 10^{-6}$.

8. The sensing system of claim 4 wherein:

said magnetic thin film is provided having a thickness in the range of 5 nanometers to 500 nanometers.

9. The sensing system of claim 5 wherein at least one of the magnetic layers of said thin film is comprised of iron and boron.

10. A stress sensing system comprising:

a light source;

a magneto-optic Kerr effect stress sensor wherein said magnetooptic Kerr effect stress sensor comprises a magnetic film having first and second opposing surfaces and having a uniaxial anisotropy field characteristic of a predetermined intensity, wherein the magnetic film has at least one domain having a magnetization characteristic which rotates in response to application of an applied stress;

a polarizer disposed between said light source and said magnetooptic Kerr effect stress sensor wherein said light source directs a light beam toward said polarizer and said polarizer passes light having a first predetermined polarization said such that the light having the predetermined polarization is incident upon said magnetooptic Kerr effect stress sensor; and a first detector disposed to receive the portion of the light signal reflected from said magneto-optic Kerr effect stress sensor.

11. The stress sensing system of claim 10 wherein:

said magnetic film is provided having a thickness typically in the range of 5 nanometers to 500 nanometers and is provided from a first one of:

a single layer of a ferro-magnetic material; and a single layer of a ferri-magnetic material.

12. The sensor system of claim 11 wherein said single layer is comprised of iron and boron.

13. The stress sensing system of claim 10 wherein said stress sensor is disposed such that a hard axis of said magnetic film is disposed at an angle 45 degrees relative to a light plane of incidence and such that a magnetization orientation for no applied stress lies transverse to the hard axis and at a 45 degree angle relative to the light plane of incidence.

14. The stress sensing system of claim 13 further comprising a polarization splitter disposed to intercept light specularly reflected from said stress sensor wherein said polarization splitter passes at least a portion of the light incident thereon and reflects at least a portion of the light incident thereon wherein said polarization splitter is oriented to mix in a predetermined manner portions of the light signal having the first polarization with portions of the light signal having a second different polarization and wherein portions of the lights signal which pass through said polarization splitter are detected by said first detector.

15. The stress sensing system of claim 14 further comprising a second detector disposed to receive the portion of the light signal which is reflected by said polarization splitter.

16. The stress sensing system of claim 13 further comprising a second polarizer disposed to intercept at least a portion of the light signal reflected from said stress sensor wherein said second polarizer attenuates the intensity of light having the first polarization wherein said detector is disposed to detect light which passes through said second polarizer.

17. The stress sensing system of claim 13 further comprising a magnetic shield disposed about said magneto-optic Kerr effect stress sensor.

18. The stress sensing system of claim 13 wherein said magneto-optic Kerr effect stress sensor includes at least one magnetic layer having a saturation magnetostriction constant greater than $25 \times 10^{-6}$.

19. The stress sensing system of claim 10 wherein said magneto-optic Kerr effect stress sensor is disposed on a coupler half-block.

\* \* \* \* \*